United States Patent
Chen

(10) Patent No.: US 8,934,300 B1
(45) Date of Patent: Jan. 13, 2015

(54) MEMORY ARRAY STRUCTURE AND OPERATING METHOD AND MANUFACTURING METHOD FOR THE SAME

(71) Applicant: Macronix International Co., Ltd., Hsinchu (TW)

(72) Inventor: Shih-Hung Chen, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/073,901

(22) Filed: Nov. 7, 2013

(51) Int. Cl.
| | |
|---|---|
| G11C 16/04 | (2006.01) |
| G11C 16/16 | (2006.01) |
| G11C 5/02 | (2006.01) |
| G11C 5/06 | (2006.01) |
| G11C 8/12 | (2006.01) |
| G11C 16/02 | (2006.01) |
| H01L 21/283 | (2006.01) |
| G11C 16/34 | (2006.01) |
| G11C 7/18 | (2006.01) |

(52) U.S. Cl.
CPC ............... *G11C 5/063* (2013.01); *G11C 16/02* (2013.01); *H01L 21/283* (2013.01); *G11C 5/06* (2013.01); *G11C 5/02* (2013.01); *G11C 16/3427* (2013.01); *G11C 16/0483* (2013.01); *G11C 7/18* (2013.01)
USPC ............ 365/185.05; 365/185.11; 365/185.17; 365/185.18; 365/51; 365/63

(58) Field of Classification Search
CPC .......... G11C 16/0483; G11C 16/3427; G11C 16/3418; G11C 5/02; G11C 5/025; G11C 5/06; G11C 5/063; G11C 7/18
USPC ............. 365/185.05, 185.11, 185.17, 185.18, 365/51, 63
See application file for complete search history.

(56) References Cited

U.S. PATENT DOCUMENTS

| | | | |
|---|---|---|---|
| 6,351,410 B1 * | 2/2002 | Nakao et al. ................... | 365/171 |
| 2007/0181925 A1 * | 8/2007 | Yoon et al. .................... | 257/296 |
| 2010/0155959 A1 * | 6/2010 | Park et al. ..................... | 257/773 |
| 2010/0244269 A1 * | 9/2010 | Kim .............................. | 257/773 |
| 2013/0264626 A1 * | 10/2013 | Sawa ............................. | 257/316 |

* cited by examiner

*Primary Examiner* — Ly D Pham
(74) *Attorney, Agent, or Firm* — McClure, Qualey & Rodack, LLP

(57) ABSTRACT

A memory array structure is provided. The memory array structure comprises a ring-shaped electrical pattern comprising a plurality of word lines, an array area comprising a first array, a second array and a plurality of bit lines, and a contact area comprising a plurality of contact points. The first array comprises one part of the word lines, and a first ground select line and a first string select line disposed on both sides of the word lines. The second array comprises another part of the word lines, and a second ground select line and a second string select line disposed on both sides of the word lines. The bit lines are disposed on the first array and the second array, and cross both of the first array and the second array. The word lines electrically contact with an external circuit through the contact points.

12 Claims, 19 Drawing Sheets

… (1)

MEMORY ARRAY STRUCTURE AND OPERATING METHOD AND MANUFACTURING METHOD FOR THE SAME

BACKGROUND

1. Technical Field

The disclosure relates in general to a memory array structure and a method for operating and a method for manufacturing the same, and more particularly to a memory array structure comprising a ring-shaped pattern and a method for operating and a method for manufacturing the same.

2. Description of the Related Art

With the advancement of technology for manufacturing the memory, the demand for the memory device focuses on small size and large memory capacity. For satisfying the requirement, a memory having a high element density is need. However, in the memory having a high element density, the reduced pattern width increases the resistance, and the reduced space increases the capacitance, such that an RC delay occurs. The RC delay not only results in lower data rate but also degrade the reliability of the memory device.

Besides, the process conventionally used in manufacturing memory device needs at least three photo/etch processes including the step of cutting pattern. The complicated processes result in expensive manufacturing cost.

SUMMARY

The disclosure is directed to a memory array structure comprising a ring-shaped pattern. The manufacturing method for the memory array structure does not need a step of cutting pattern and does not need additional steps in the process. The memory array structure comprising a ring-shaped pattern degrades the RC delay effectively.

According to one embodiment, a memory array structure is provided. The memory array structure comprises a ring-shaped electrical pattern comprising a plurality of word lines, an array area comprising a first array, a second array and a plurality of bit lines, and a contact area comprising a plurality of contact points. The first array comprises one part of the word lines, a first ground select line and a first string select line. The first ground select line and the first string select line are disposed on both sides of the word lines. The second array comprises another part of the word lines, a second ground select line and a second string select line. The second ground select line and the second string select line are disposed on both sides of the word lines. The bit lines are disposed on the first array and the second array, and cross both of the first array and the second array. The word lines electrically contact to an external circuit through the contact points.

According to another embodiment, a method for operating a memory array structure is provided. The memory array structure comprises a ring-shaped electrical pattern comprising a plurality of word lines, an array area comprising a first array, a second array and a plurality of bit lines, and a contact area comprising a plurality of contact points. The first array comprises one part of the word lines, a first ground select line and a first string select line. The first ground select line and the first string select line are disposed on both sides of the word lines. The second array comprises another part of the word lines, a second ground select line and a second string select line. The second ground select line and the second string select line are disposed on both sides of the word lines. The bit lines are disposed on the first array and the second array, and cross both of the first array and the second array. The word lines electrically contact to an external circuit through the contact points. The operating method for the memory array structure comprises following steps. A supply voltage is provided to the first string select line and the second string select line. One of the first array and the second array is selected as a selected array, while another one of the first array and the second array is selected as a non-selected array. The voltage of the siring select line in the non-selected array is set to be zero, such that the conductive channels in the non-selected array are floating. The voltage of a selected bit line is set to be zero, while other non-selected bit lines keep floating. The word lines in the selected array have an operating voltage. The word lines in the non-selected array have a voltage to prevent the operation of the word lines in the non-selected array.

According to another embodiment, a method for manufacturing a memory array structure is provided. The method comprises the following steps. A patterned mask layer is provided on an electrode layer. A space layer is deposited on the patterned mask layer and the electrode layer. The space layer is patterned to form at least one spacer on the sidewall of the patterned mask layer. The patterned mask layer is removed. A patterned photoresist layer is formed on the electrode layer. A ring-shaped electrical pattern, a first ground select line, a first string select line, a second ground select line and a second string select line are formed by the spacer and the patterned photoresist layer. The ring-shaped electrical pattern comprises a plurality of word lines without proceeding a cutting process, such that each of the word lines is formed of a continuous closing shape.

The above and other aspects of the disclosure will become better understood with regard to the following detailed description of the non-limiting embodiment(s). The following description is made with reference to the accompanying drawings.

Figure 1:
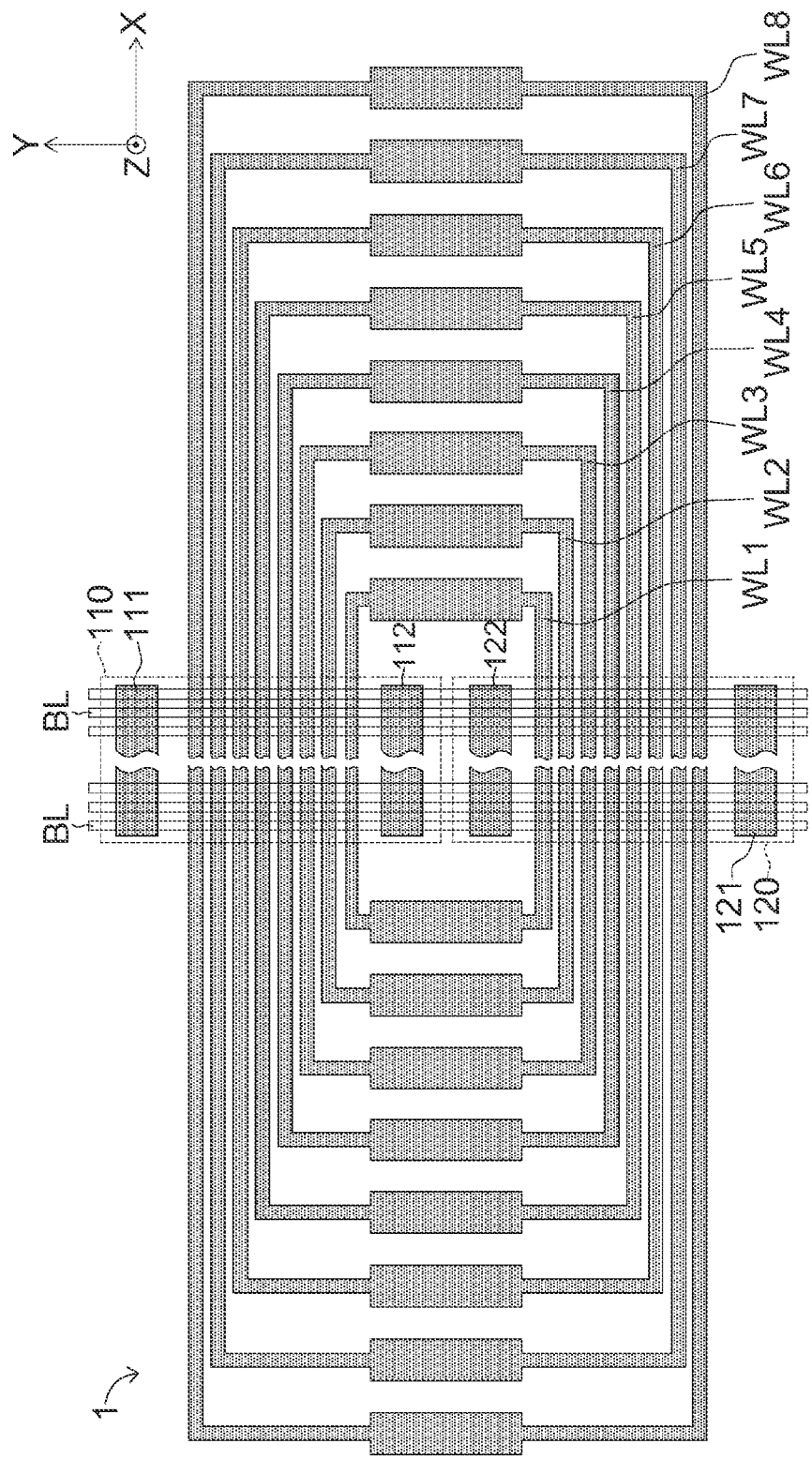
FIG. 1 illustrates a portion of a memory array structure according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A memory array structure according to the disclosure is provided. The memory array structure includes a ring-shaped electrical pattern including a plurality of word lines, an array area including a first array, a second array and a plurality of bit lines, and a contact area including a plurality of contact points. The first array includes one part of the word lines, a first ground select line and a first string select line. The first ground select line and the first string select line are disposed on both sides of the word lines. The second array includes another part of the word lines, a second ground select line and a second string select line. The second ground select line and the second string select line are disposed on both sides of the word lines. The bit lines are disposed on the first array and the second array, and cross both of the first array and the second array. The word lines electrically contact to an external circuit through the contact points.

FIG. 1 illustrates a portion of a memory array structure according to one embodiment of the disclosure. As shown in FIG. 1, the ring-shaped electrical pattern 1 includes a plurality of word lines WL1~WL8, wherein each word line is ring-shaped. It should be noted that the word lines WL1~WL8 in the disclosure are shown in rectangular shape, however, the disclosure is not limited thereto. On the contrary, the number and shape of the ring-shaped word lines are according to the design of the memory array structure.

In one embodiment, the ring-shaped electrical pattern 1 may be manufactured by a double patterning process without the step of cutting pattern. Compared with the conventional process including at least three photo/etch steps, the ring-shaped electrical pattern 1 according to the disclosure effectively lowers the cost.

Figure 2A:
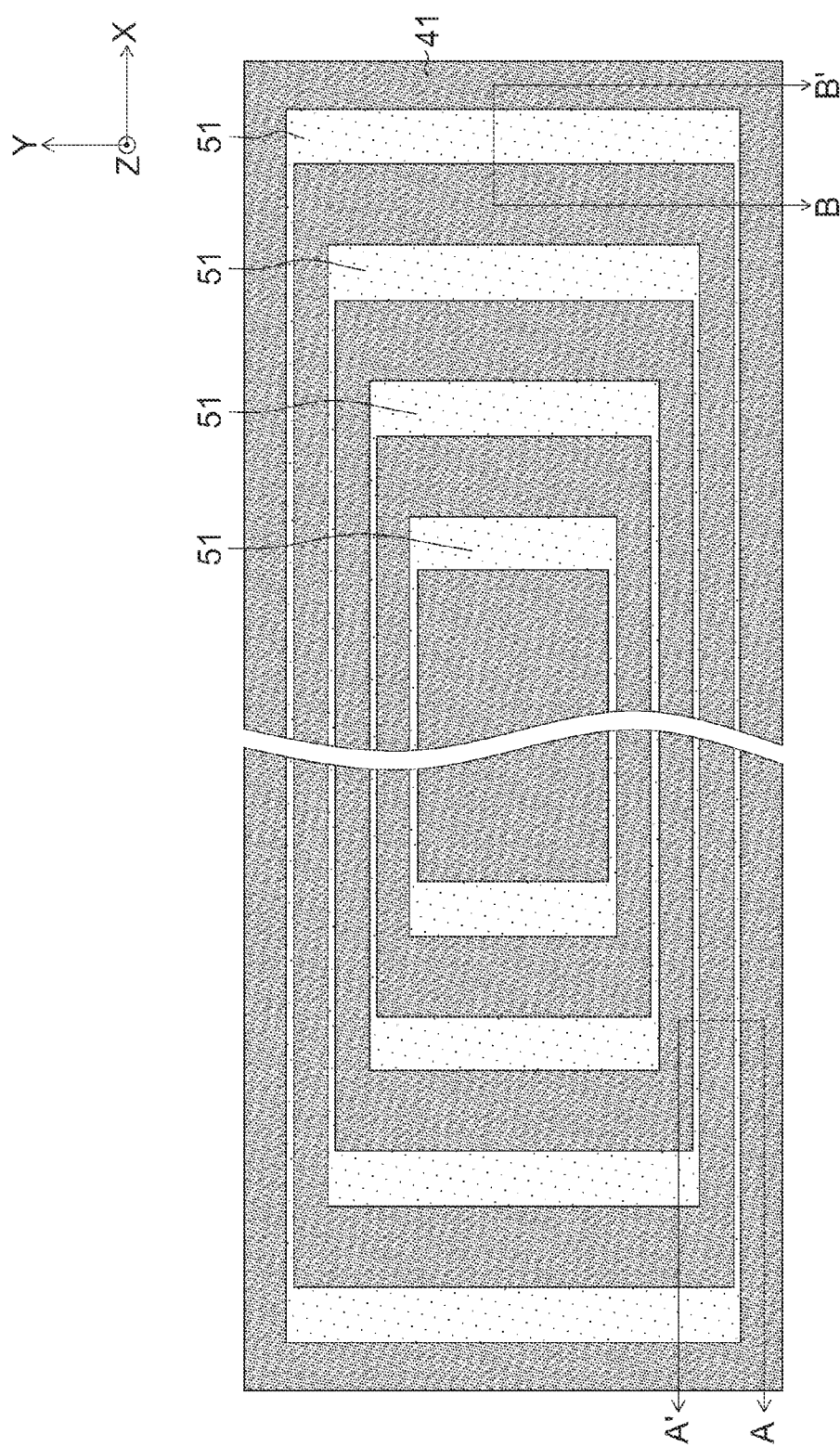
FIGS. 2A to 7C illustrate a process for manufacturing a memory array structure in one embodiment according to the disclosure.
Figure 2B:
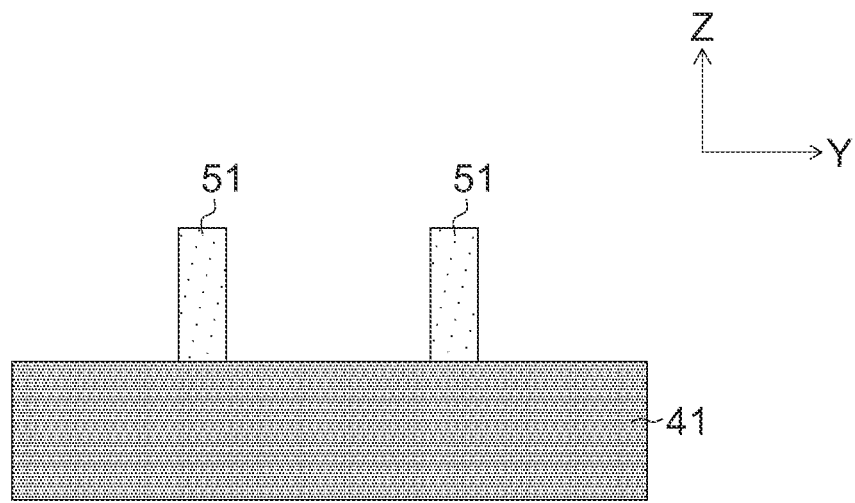
Figure 2C:
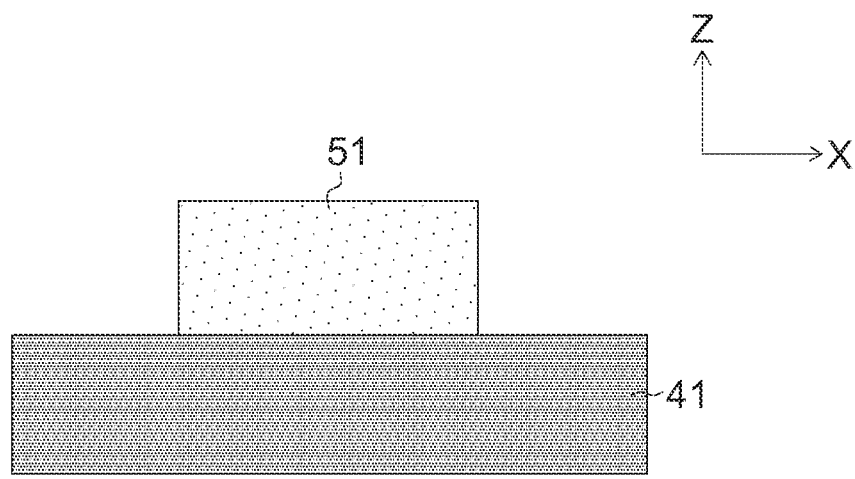

FIGS. 2A to 7C illustrate a process for manufacturing a memory array structure in one embodiment according to the disclosure. FIG. 2B illustrates a cross-sectional view of the structure along A-A line in FIG. 2A, FIG. 2C illustrates a cross-sectional view of the structure along B-B' line in FIG. 2A. As shown in FIGS. 2A-2C, a patterned mask layer 51 is provided on an electrode layer 41. The material of the patterned mask layer 51 may be $SiO_2$.

Figure 3A:
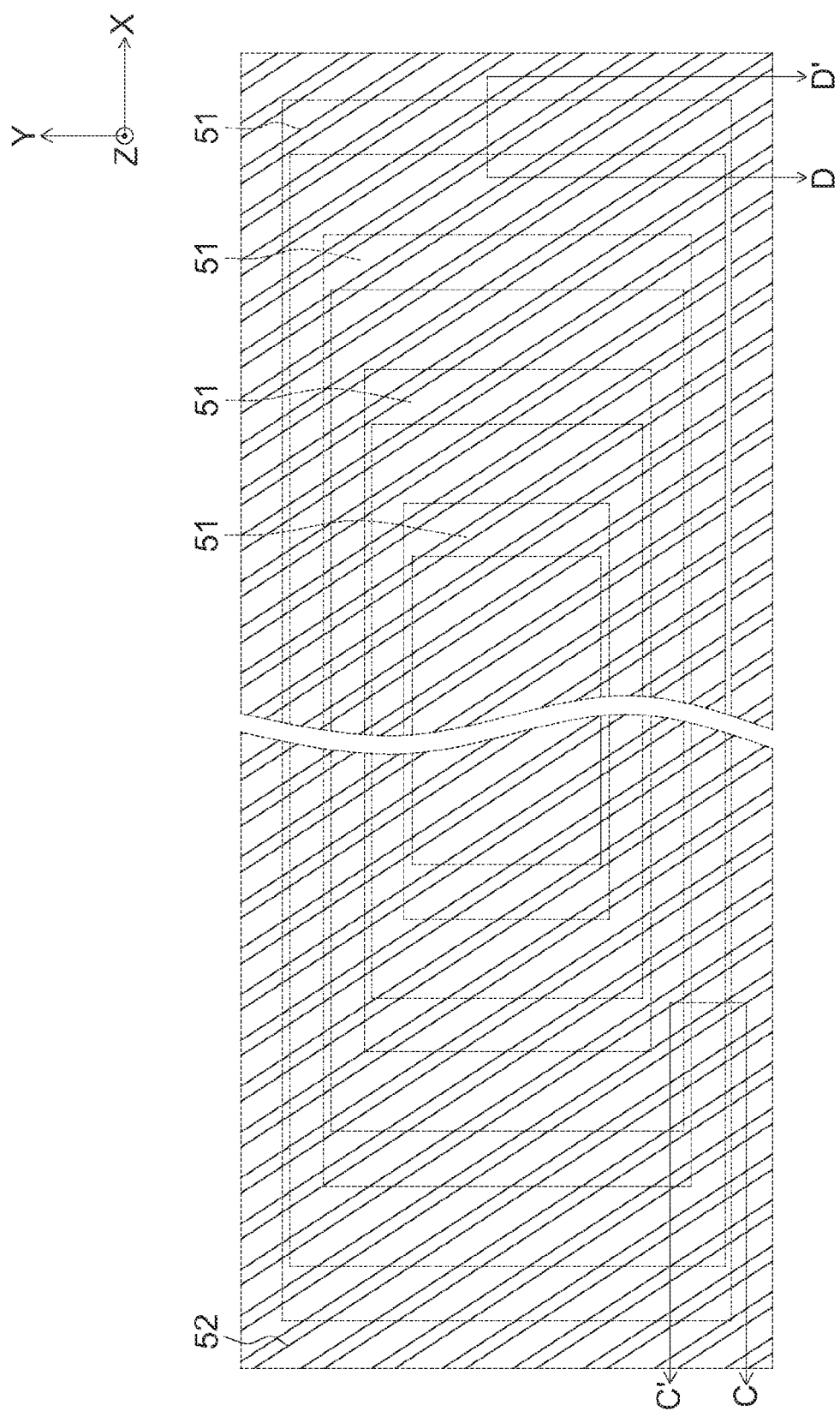
Figure 3B:
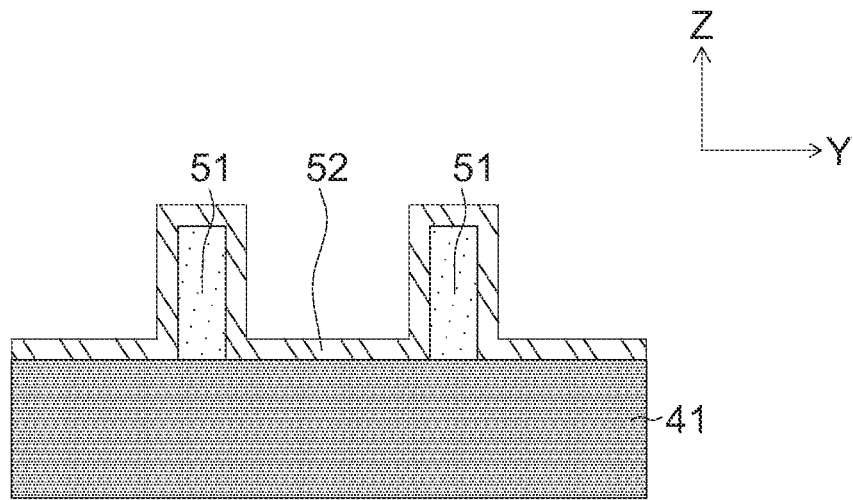
Figure 3C:
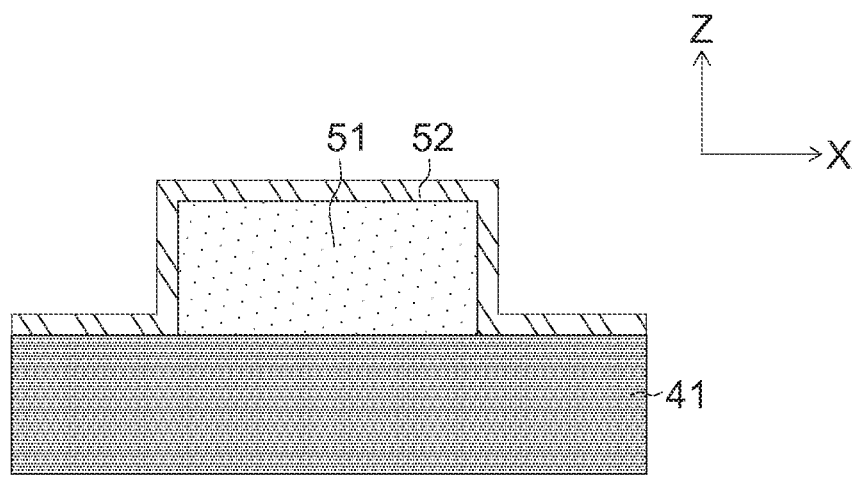

FIG. 3B illustrates a cross-sectional view of the structure along C-C' line in FIG. 3A. FIG. 3C illustrates a cross-sectional view of the structure along D-D' line in FIG. 3A. As shown in FIGS. 3A-3C, a space layer 52 is deposited on the patterned mask layer 51 and the electrode layer 41. The material of the space layer may be SiN.

Figure 4A:
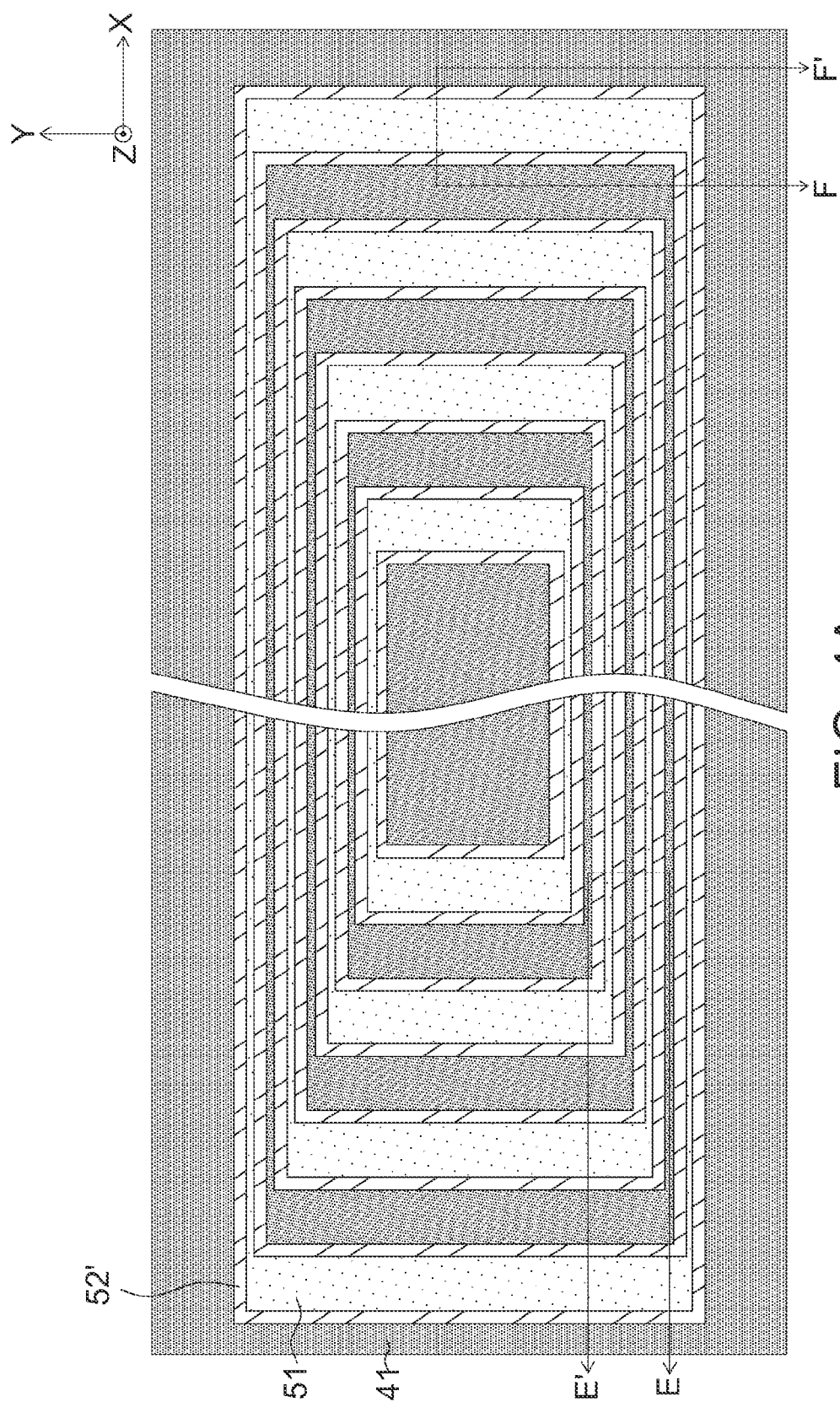
Figure 4B:
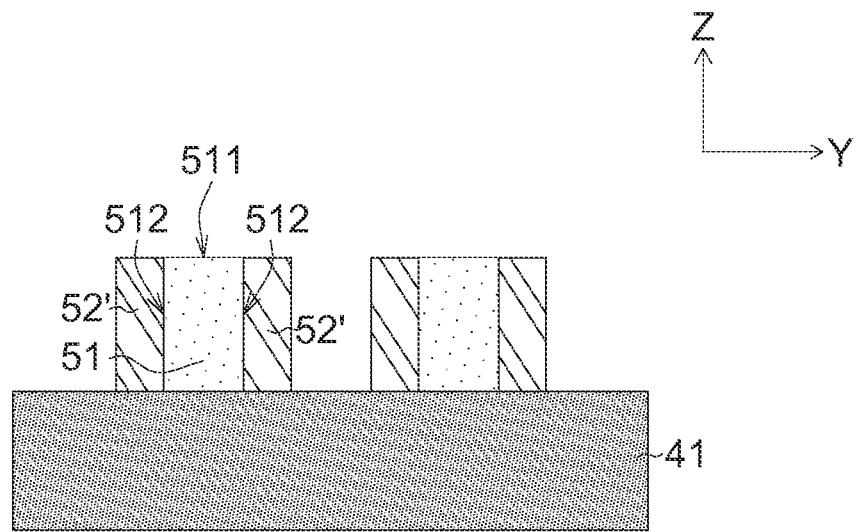
Figure 4C:
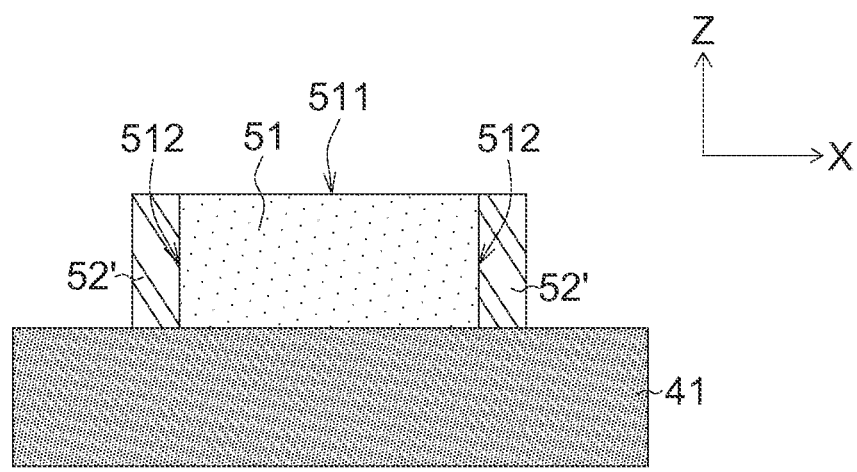

FIG. 4B illustrates a cross-sectional view of the structure along E-E' line in FIG. 4A. FIG. 4C illustrates a cross-sectional view of the structure along F-F' line in FIG. 4A. As shown in FIGS. 4A~4C, the space layer 52 is patterned. In this embodiment, the space layer 52 parallel with the electrode layer 41 (in X-Y plane) is etched, such that at least one spacer 52' is formed on the side all 512 of the patterned mask layer 51, and the upper surface 511 of the patterned mask layer 51 is exposed.

Figure 5A:
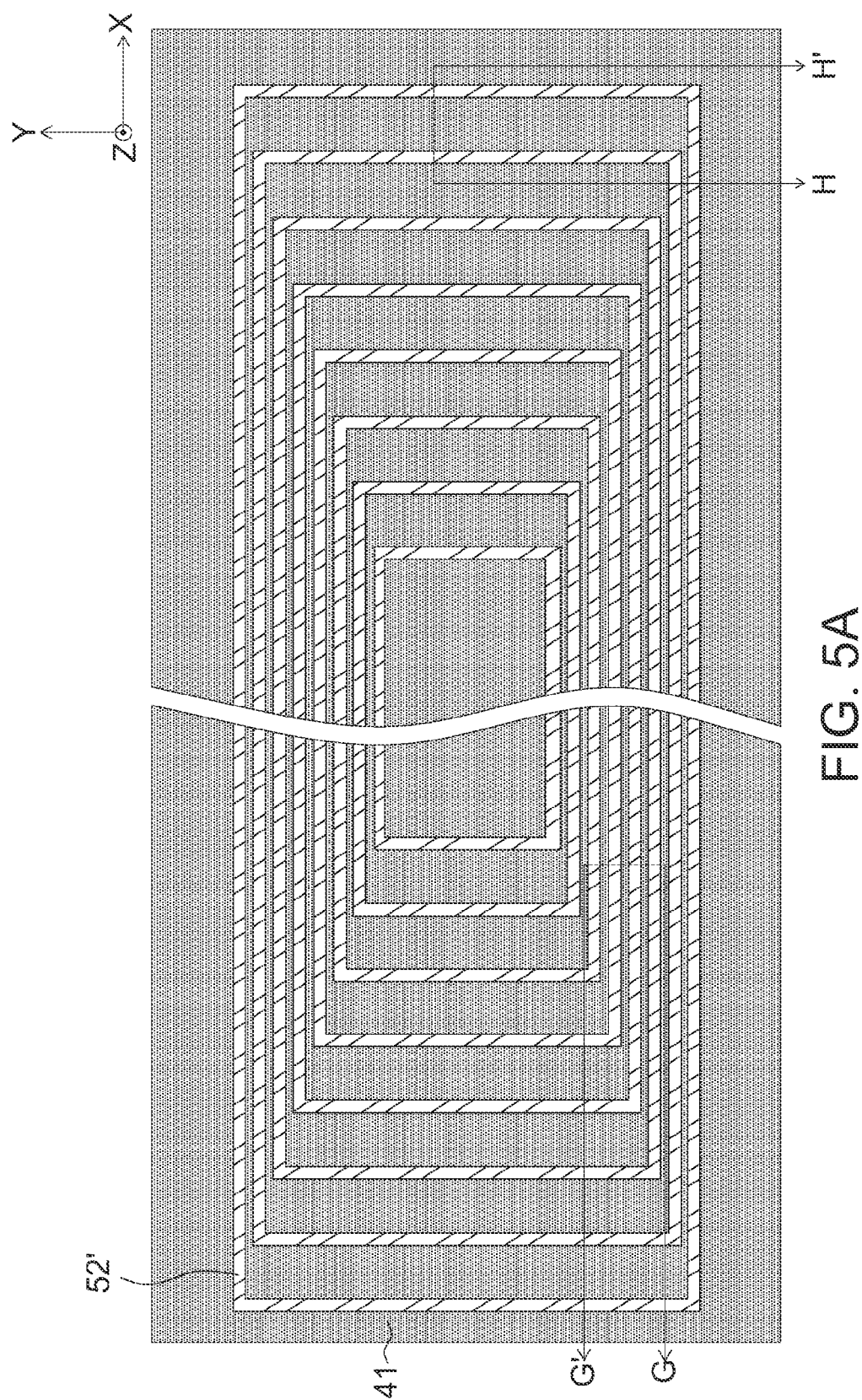
Figure 5B:
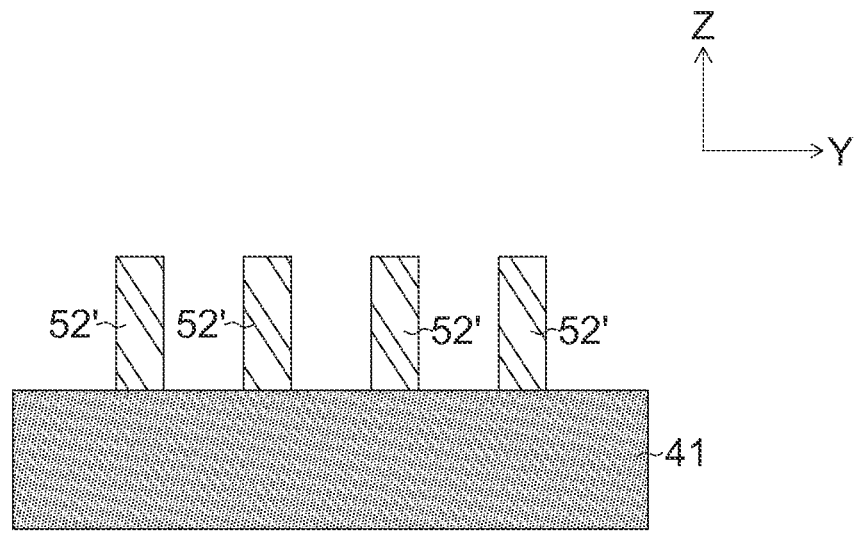
Figure 5C:
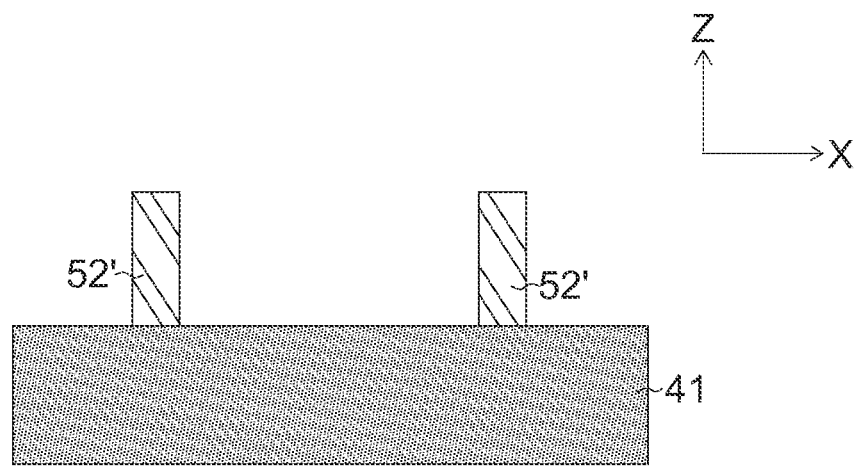

FIG. 5B illustrates a cross-sectional view of the structure along G-G' line in FIG. 5A. FIG. 5C illustrates a cross-sectional view of the structure along H-H' line in FIG. 5A. As shown in FIGS. 5A~5C, the patterned mask layer 51 is removed, for example, an etching process is implemented to remove the patterned mask layer 51.

Figure 6A:
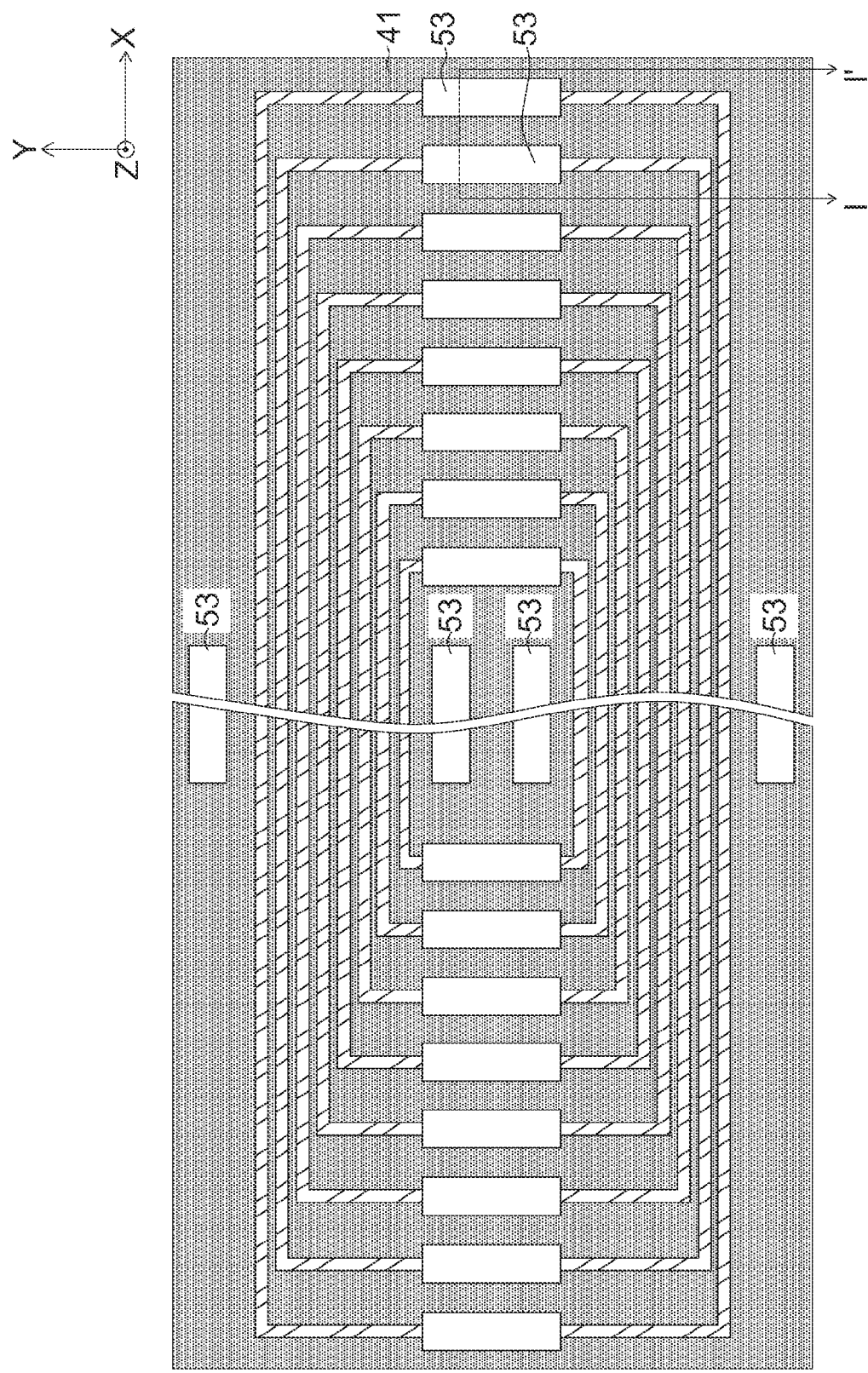
Figure 6B:
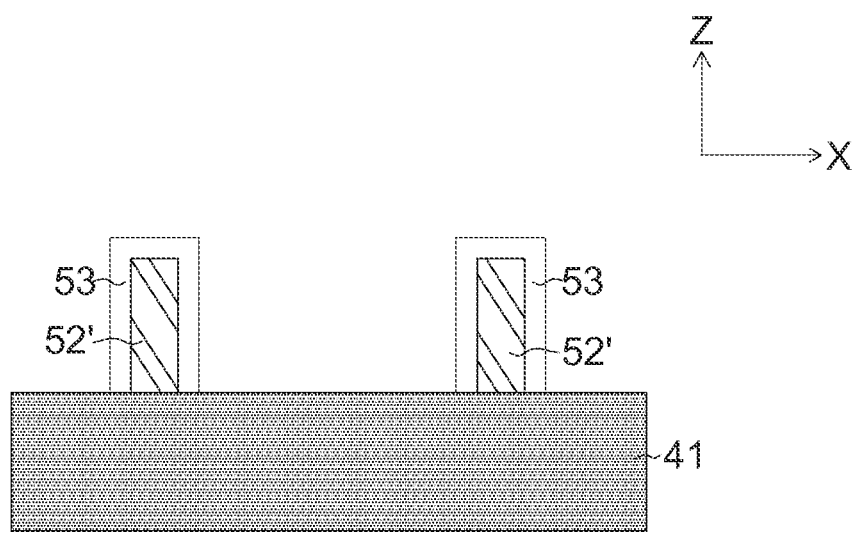

FIG. 6B illustrates a cross-sectional view of the structure along I-I' line in FIG. 6A. As shown in FIGS. 5A and 6B, a patterned photoresist layer 53 is formed on the electrode layer 41. In one embodiment, the patterned photoresist layer 53 is formed on a part of the spacer 52' parallel with Y-direction.

Figure 7A:
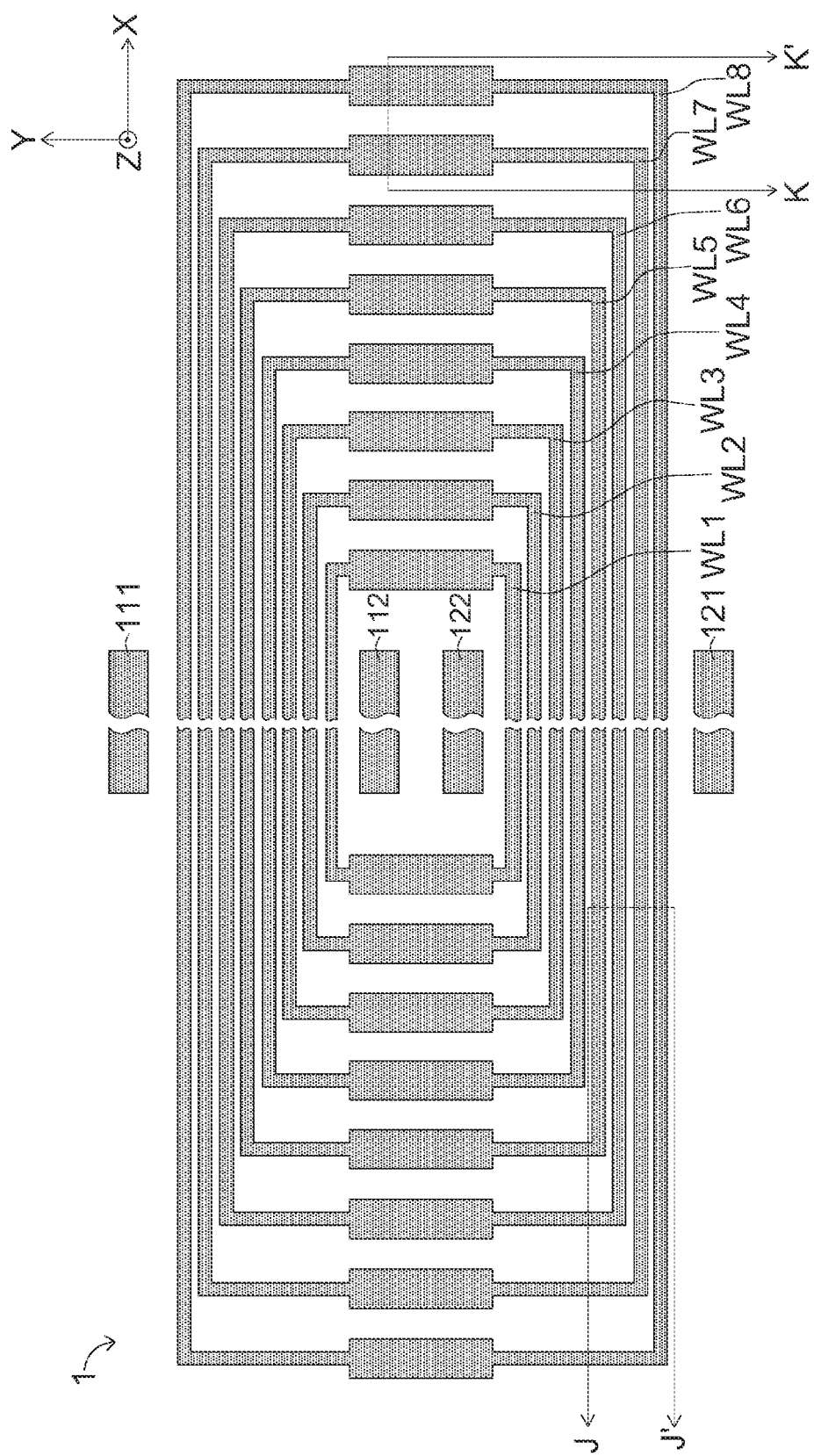
Figure 7B:
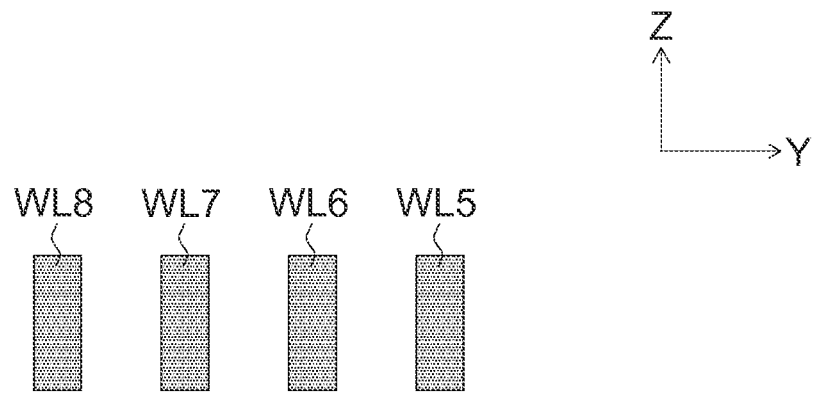
Figure 7C:
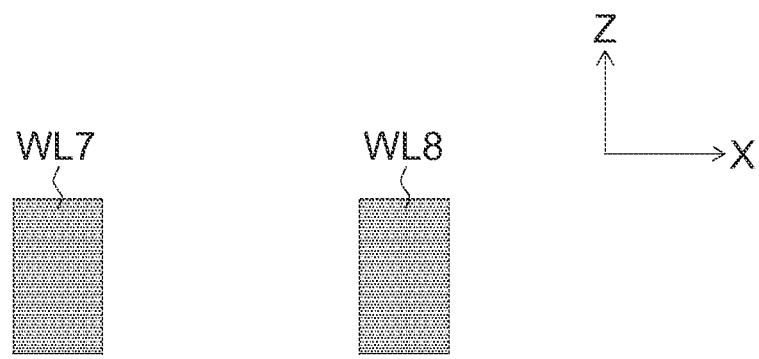

FIG. 7B illustrates a cross-sectional view of the structure along J-J' line in FIG. 7A. FIG. 7C illustrates a cross-sectional view of the structure along K-K' line in FIG. 7A. As shown in FIGS. 7A~7C, the ring-shaped electrical pattern 1, a first around select line (GSL) 111, a first string select line (SSL) 112, a second ground select line 121 and a second string select line 122 are formed by the spacer 52' and the patterned photoresist layer 53. In this embodiment, the ring-shaped electrical pattern 1 includes a plurality of word lines WL1~WL8. A cutting process does not be implemented on each of the word lines WL1~WL8 such that each of the word lines WL1~WL8 is formed of a continuous closing shape (such as ring-shape).

Referring to FIG. 1, the memory array structure may include a first array 110, a second array 120 and a plurality of bit lines BLs. The first array 110 includes one part of the word lines (such as the upper portion of the word lines WL1~WL8), the first ground select line (GSL) 111 and the first string select line (SSL) 112. The first ground select line 111 and the first string select line 112 are disposed on both sides of the word lines in the first array 110. The second array 120 includes another part of the word line (such as the lower portion of the word lines WL1~WL8), the second ground select line 121 and the second string select line 122. The second ground select line 121 and the second string select line 122 are disposed on both sides of the word lines in the second array 120. The bit lines BLs are disposed on the first array 110 and the second array 120, and cross both of the first array 110 and the second array 120.

It should be noted that although FIG. 1 shows the number of the bit lines BLs is six, however, the disclosure is not limited thereto. The memory array structure according to one embodiment of the disclosure may be determined to operate the word lines in the first array 110 or the second array 120 by the first ground select line 111, the first string select line 112, the second ground select line 121 and the second string select line 122.

In one embodiment, a method for operating the memory array structure according to the disclosure comprises the following steps. A supply voltage is provided to the first string select line 112 and the second string select line 122. One of the first array 110 and the second array 120 is selected as a selected array, while another one of the first array 110 and the second array 120 is selected as a non-selected array. The voltage of the string select line in the non-selected array is set to be zero, such that the conductive channels in the non-selected array are floating. The voltage of a selected bit line is set to be zero, while other non-selected bit lines keep floating. The word lines in the selected array have an operating voltage, such as a programming or read voltage. The word lines in the non-selected array have a voltage to prevent the operation of the word lines in the non-selected array.

For example, if users intend to program the bit lines 1, 3, 5 counted from the left side and the word lines WL1~8 in the second array 120, it may be operated by the following steps. First, a supply voltage Vcc is provided to the first string select line 112 and the second string select line 122. At this time, the voltage of the first ground select line 111 and the voltage of the second ground select line 121 are zero, such that the voltage of the word lines WL1~WL8 in the first array 110 and the second 120 are zero and the all bit lines BLs are charged. Then, the voltage of the first string select line 112 is set to be zero, such that the conductive channels in the first array 110 are floating. The voltages of the bit lines 1, 3, 5 counted from the left side are set to be zero and the voltages of the other bit lines keep Vcc, such that the bit lines 1, 3, 5 counted from the left side are discharged while the other bit lines keep floating. At this time, the selected word lines (word line WL1~WL8 in the second array 120) have a programming voltage Vpgm, and the word line WL1~WL8 in the second array 120 is programmed. On the contrary, the non-selected word lines have a voltage Vpass because the floating channels are boosted, such that the non-selected word lines are prevented from programmed.

Figure 8:
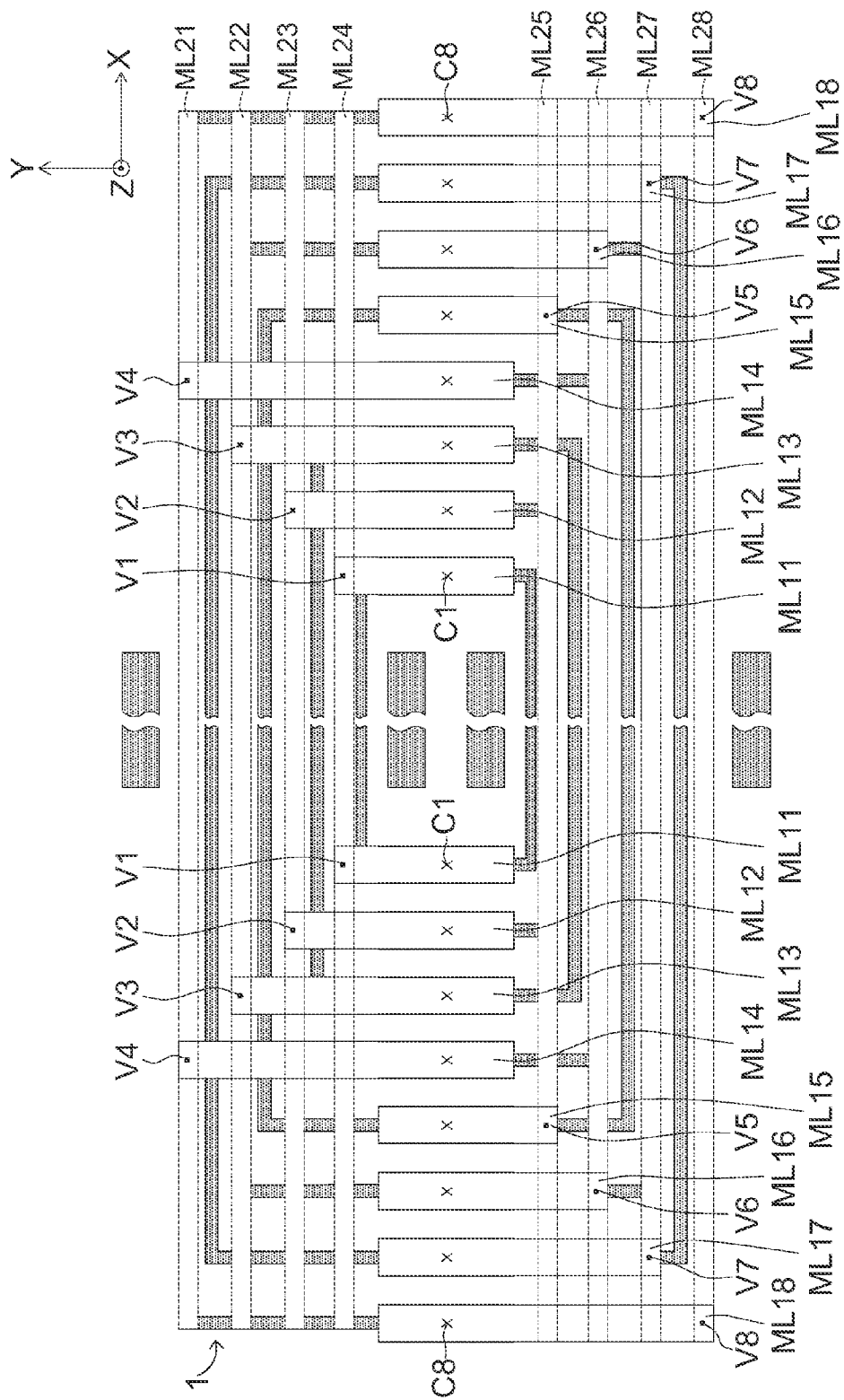
FIG. 8 illustrates a portion of a memory array structure according to another embodiment of the disclosure.

FIG. 8 illustrates a portion of a memory array structure according to another embodiment of the disclosure. In this embodiment, the memory array structure further includes a plurality of a first metal line and a second metal line. The first metal lines ML11~ML18 and the second metal lines ML21~ML28 are illustrated as an example in FIG. 8.

The first metal lines ML11~ML18 are disposed on the ring-shaped electrical pattern 1. Each of the word lines WL1~WL8 electrically connect with two first metal lines through contact points. For example, the word line WL1 electrically connects to two first metal lines ML11 through the contact points C1, and the word line WL8 electrically connects to two first metal lines ML18 through the contact points C8.

The second metal lines ML21~ML28 are disposed on and electrically connect with the first metal lines ML11~ML18. In one embodiment, the second metal lines ML21~ML28 are electrically connect with the first metal lines ML11~ML18 through vias V1~V8.

In one embodiment, each word line corresponds to two vias, and the two vias are mirror symmetry. For example, the second metal line ML24 electrically connects with two first metal lines ML11. The word line WL1 corresponds to two vias V1, and the two vias V1 are mirror symmetry.

In general, the resistance of the metal line is lower than that of the word line (made of silicide). For example, the resistance of the metal line is about 0.2 ohm/square, while the resistance of the word line is about 20 ohm/square. That is, the resistance of the metal line almost may be ignored when the metal line is serious connected with the word line.

When a signal is inputted to the word line, the signal is transferred from both sides to the center area of the memory array, such that the highest loading area will move to the center of the word line. For example, when a signal is inputted to the word line WL8 through the contact point C8 from the left side, since the word line WL8 electrically connects to the first metal line ML18 on the left side, the signal is transferred to the first metal line ML18 on the left side immediately. Then, the signal is transferred to the second metal line ML28 through the via V8 on the left side, and the signal is transferred to via the V8 on the right side by the second metal line ML28. Then, the signal is transferred to the first metal line ML18 on the right side through the via V8 on the right side. Since the first metal line ML18 on the right side electrically connects with the word line WL8, the signal is transferred to the word line WL8 through the contact point C8 on the right side immediately. Because the resistance of the metal line can be ignored when the metal line is serious connected with the word line, that is, when the signal is inputted to the word line WL8 through the contact point C8 from the left side, the signal is also inputted to the word line WL8 through the contact point C8 from the right side immediately.

Figure 9:
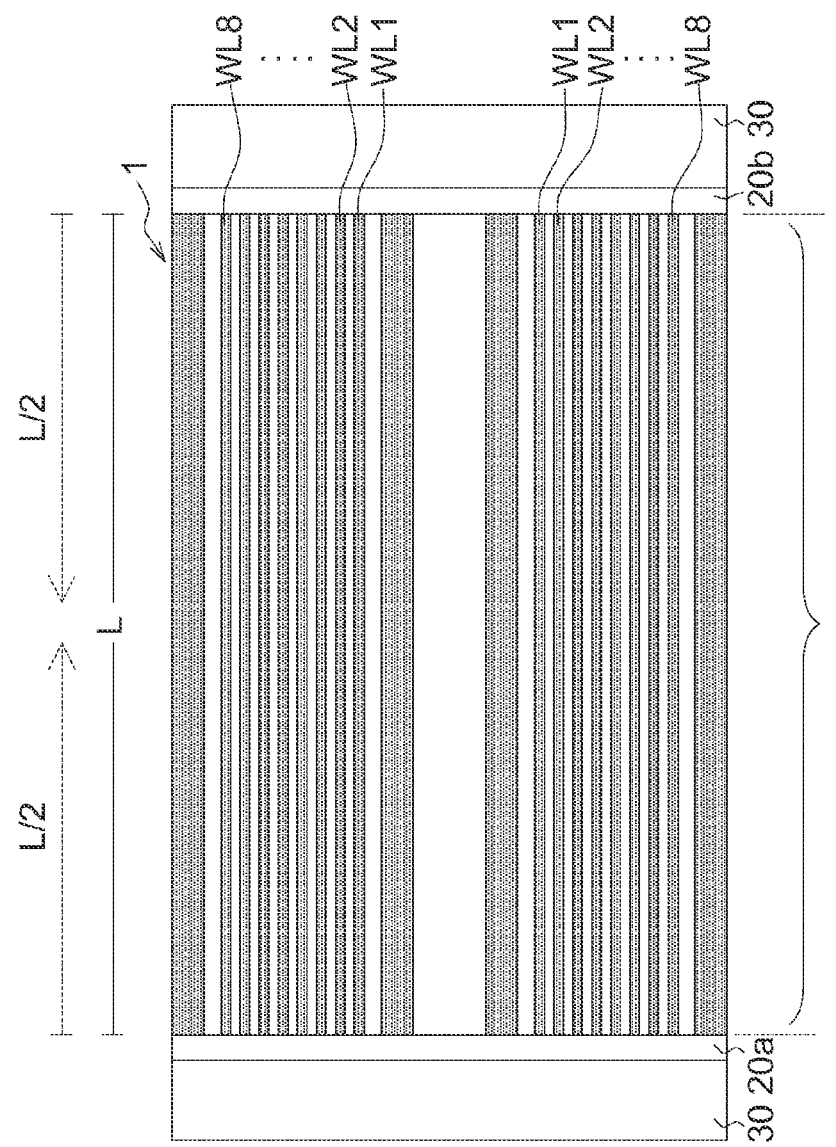
FIG. 9 illustrates a portion of a memory array structure according to one embodiment of the disclosure.

FIG. 9 illustrates a portion of a memory array structure according to one embodiment of the disclosure. The memory array structure in FIG. 9 is like the memory array structure illustrated in FIG. 8, which includes a plurality of the first metal lines and the second metal lines (not shown in FIG. 9). As shown in FIG. 9, an array area 10 includes the word lines WL1~WL8. Contact areas 20*a* and 20*b* are disposed respectively on both sides of the array area 10. Decoding areas 30 are adjacent to the contact areas 20*a* and 20*b*. That is, the decoding areas 30 are disposed on both sides of the ring-shaped electrical pattern 1. The contact areas 20*a* and 20*b* include the contact points of each word line. In this embodiment, the transferred length of a signal in the array area is L. As mentioned above, since the first and the second metal lines are disposed in the memory array structure, when the signal is inputted to each word line through the contact point on the left side, the signal is also inputted to the word line through the contact point on the right side immediately. That is, the transferred direction and path of the signal is as illustrated by the dotted arrow in FIG. 9, and the transferred length of the signal in the array area becomes L/2. Since the transferred length of the signal in the array area becomes L/2, the resistance becomes ½ of the original.

In one embodiment, the memory array structure according to the disclosure comprises at least six contact areas, such that the memory array structure is separated into at least three array areas. Each contact area comprises a plurality of the contact points, wherein each word line electrically connects to the first metal line through two different contact points. It is to be understood that although the at least six contact areas make the memory array structure separated into at least three array areas, the memory array structure according to the disclosure does not add additional decoders. That is, the space of the decoding area in the memory array structure does not increase.

Figure 10:
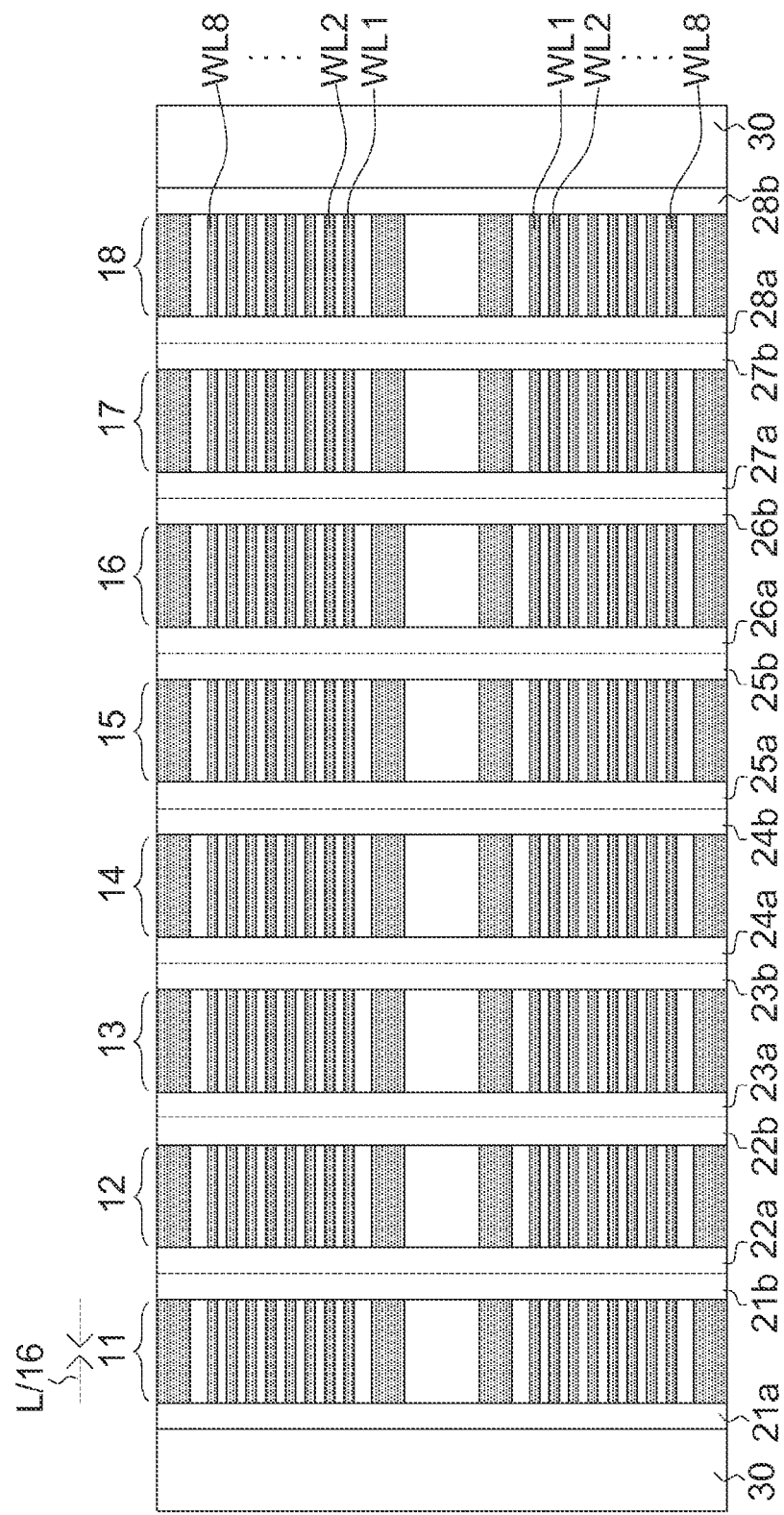
FIG. 10 illustrates a portion of a memory array structure according to another embodiment of the disclosure.

FIG. 10 illustrates a portion of a memory array structure according to another embodiment of the disclosure. The memory array structure shown in FIG. 10 includes sixteen contact areas 21*a*, 21*b*, 22*a*, 22*b*, 23*a*, 23*b*, 24*a*, 24*b*, 25*a*, 25*b*, 26*a*, 26*b*, 27*a*, 27*b*, 28*a* and 28*b*, such that the memory array structure is separated eight array areas 11~18. In this embodiment, the transferred length of the signal in the array area becomes L/16. That is, the resistance becomes 1/16 of the original. Although the capacitance becomes two times of the original (wherein the capacitances of first and the second metal lines may be ignored for simplified discussion), the RC delay becomes ⅛ of the original. Since the memory array structure according to the disclosure may lower the RC delay, it may effectively improve the reliability of the memory device.

Figure 11:
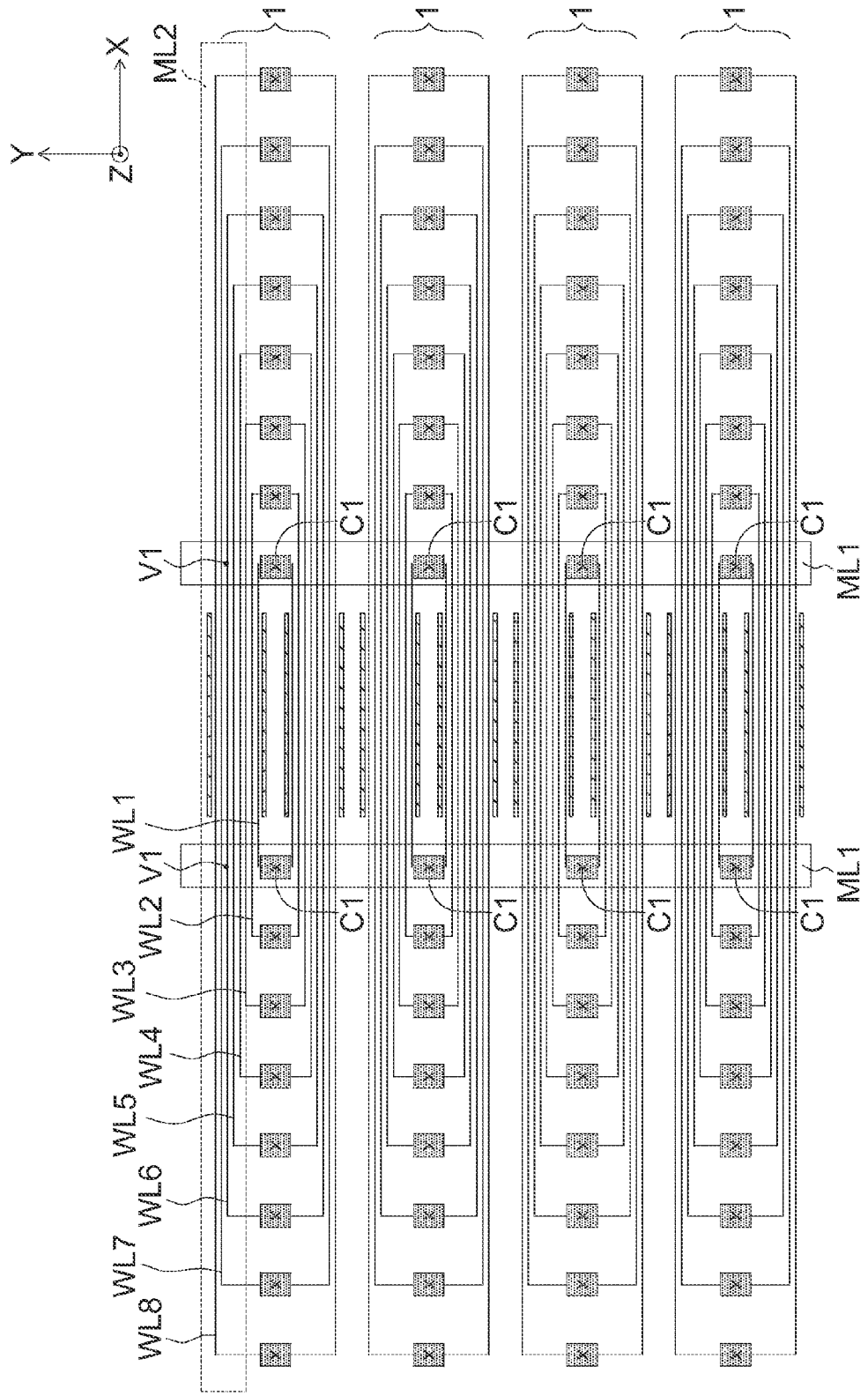
FIGS. 11 and 12 illustrate a portion of a memory array structure according to the other embodiments of the disclosure.
Figure 12:
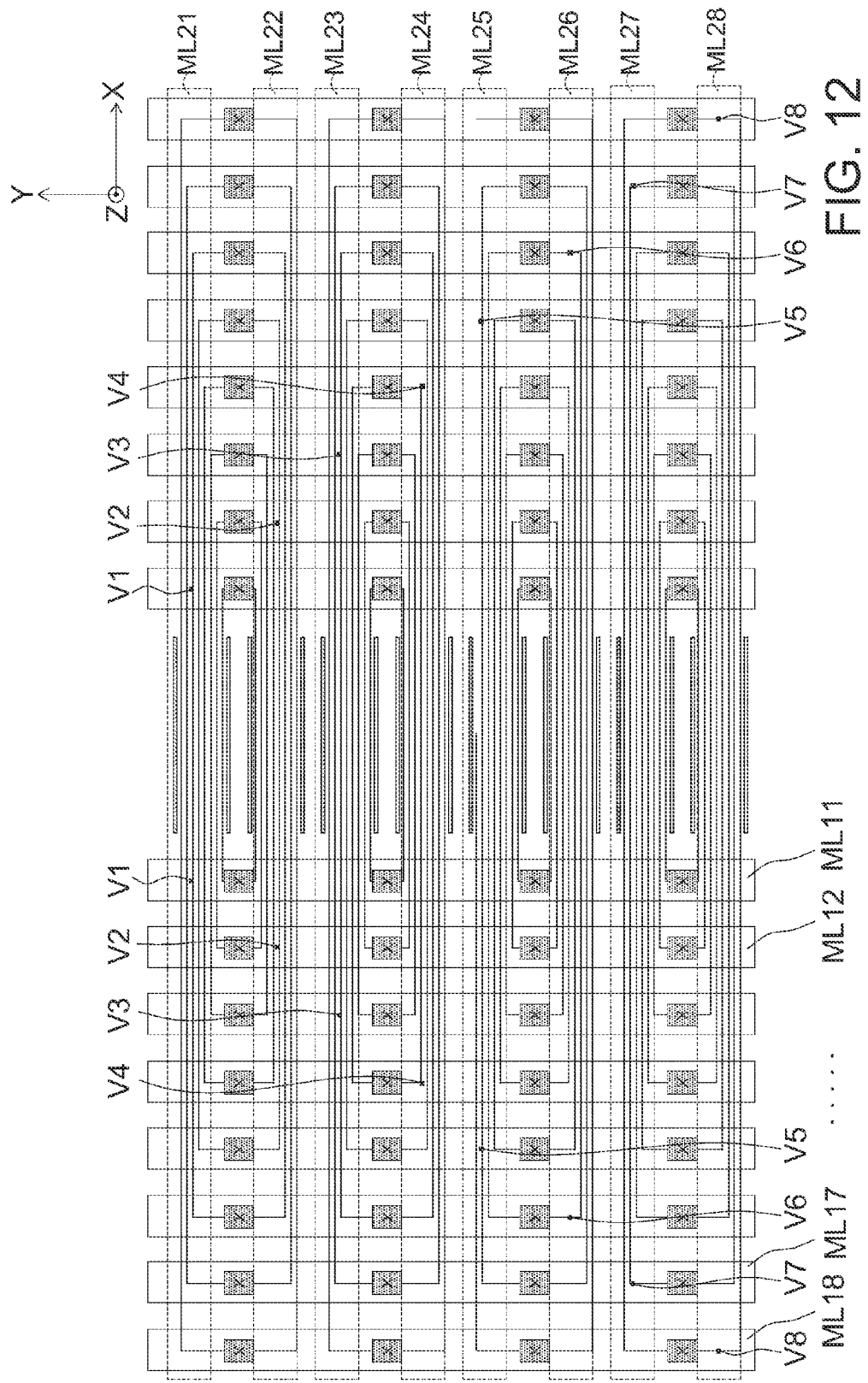

The embodiments above disclose that the memory array structure includes only one ring-shaped electrical pattern; however, the disclosure is not limited thereto. FIGS. 11 and 12 illustrate a portion of a memory array structure according to the other embodiments of the disclosure. As shown in these Figures, the memory array structure according to one embodiment of the disclosure may include a plurality of the ring-shaped electrical pattern 1.

Take the embodiment illustrated in FIG. 11 as an example, the memory array structure may include four ring-shaped electrical patterns 1. Likewise, the word lines of the ring-shaped electrical patterns 1 may electrically connect with the first metal line ML1 through the contact point C1 Hence, the four ring-shaped electrical patterns 1 can electrically connect with one another through the first metal line ML1. In more detail, the four ring-shaped electrical patterns 1 electrically connect with one another through the first metal line ML1 and the first metal line ML1 electrically connect with the second metal line ML2 through the via V1.

Take the embodiment illustrated in FIG. 12 as an example, the memory array structure may include four ring-shaped electrical patterns 1. Likewise, the word lines WL1~WL8 of the ring-shaped electrical patterns 1 electrically connect with the first metal lines ML11~ML18 through the contact point. Hence, the four ring-shaped electrical patterns 1 can electrically connect with one another through the first metal lines ML11~ML18. In more detail, the word lined WL1~WL8 of the four ring-shaped electrical patterns 1 electrically connect with one another through the first metal lines ML11~ML18. Each ring-shaped electrical pattern 1 corresponds to two second metal lines. For example, the first ring-shaped electrical pattern 1 from the top corresponds to the second metal lines ML21 and ML22. In this embodiment, the memory array structure includes eight second metal lines ML21~ML28.

In one embodiment, each word line corresponds to two vias. As shown in FIG. 12, the word lines WL1 of the four ring-shaped electrical pattern 1 corresponds to two vias V1, while the word lines WL2~WL8 of the four ring-shaped electrical pattern 1 corresponds to vias V2~V8 respectively. However, the disclosure is not limited thereto.

Figure 13:
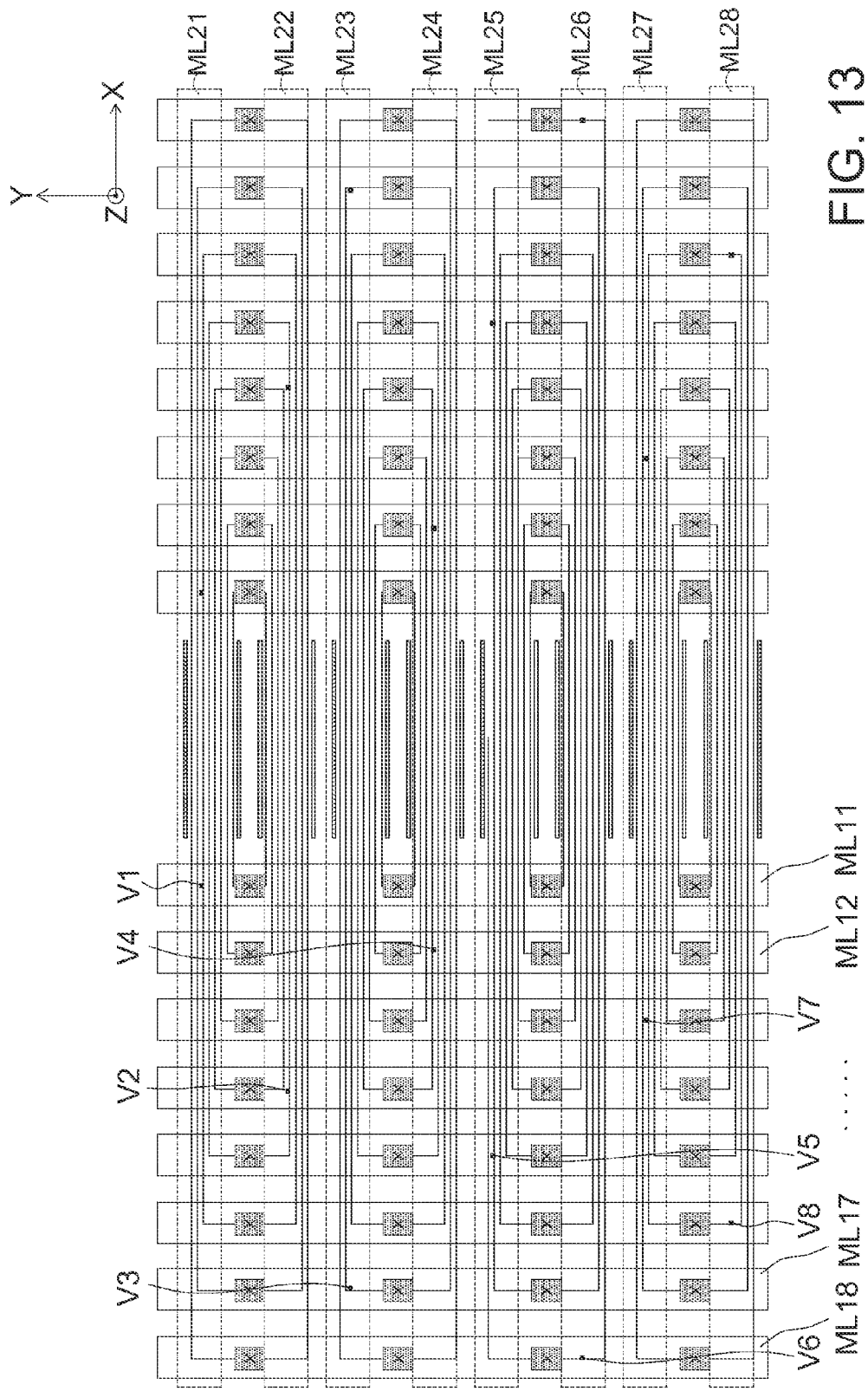
FIG. 13 illustrates a portion of a memory array structure according to another embodiment of the disclosure.

FIG. 13 illustrates a portion of a memory array structure according to another embodiment of the disclosure. The difference between the memory array structure in FIG. 13 and in FIG. 12 is the location of the two vias to which each word line corresponds. As shown in FIG. 13, the word lines WL1 of the four ring-shaped electrical pattern 1 corresponds to two vias V1, the word lines WL2 of the four ring-shaped electrical pattern 1 corresponds to two vias V4, the word lines WL3 of the four ring-shaped electrical pattern 1 corresponds to two vias V7, the word lines WL4 of the four ring-shaped electrical pattern 1 corresponds to two vias V2, the word lines WL5 of the four ring-shaped electrical pattern 1 corresponds to two vias V5, the word lines WL6 of the four ring-shaped electrical pattern 1 corresponds to two vias V8, the word lines WL7 of the four ring-shaped electrical pattern 1 corresponds to two vias V3, and the word lines WL8 of the four ring-shaped electrical 1 pattern corresponds to two vias V6.

In one embodiment, the memory array structure including the ring-shaped electrical pattern according to one embodiment of the disclosure may apply to a NAND memory device.

As mentioned above, the method for manufacturing the memory array structure including the ring-shaped electrical pattern according to one embodiment of the disclosure does not need the step of cutting pattern, neither does additional steps. That is, the cost of manufacturing the memory array structure including the ring-shaped electrical pattern according to one embodiment of the disclosure is reduced. Besides, the memory array structure according to one embodiment of the disclosure can reduce RC delay, such that the reliability of the memory is improved. Further, because of the ring-shaped electrical, the space of the decoding area does not increase that would significantly help to satisfy the requirement of a memory having a high element density.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory array structure, comprising:
   a ring-shaped electrical pattern comprising a plurality of word lines, wherein each of the word lines is ring-shaped;
   an array area, comprising:
      a first array, comprising a portion of the word lines, a first ground select line and a first string select line, wherein the first ground select line and the first string select line are disposed on both sides of the portion of the word lines;
      a second array, comprising another portion of the word lines, a second ground select line and a second string select line, wherein the second ground select line and the second string select line are disposed on both sides of the another portion of the word lines; and
      a plurality of bit lines disposed on the first array and the second array and cross both of the first array and the second array; and
   a contact area comprising a plurality of contact points, wherein the word lines electrically connect with an external circuit through the contact points.

2. The memory array structure according to claim 1, further comprising:
   a plurality of first metal lines disposed on the ring-shaped electrical pattern, wherein each of the word lines electrically connects with two of the first metal lines through the contact points; and
   a plurality of second metal lines disposed on the first metal lines, wherein the second metal lines electrically connect with the first metal lines.

3. The memory array structure according to claim 2, further comprising:
   a plurality of vias, wherein the second metal lines electrically connect with the first metal lines through the vias.

4. The memory array structure according to claim 3, wherein each of the word lines corresponds to two of the vias.

5. The memory array structure according to claim 4, wherein the two of the vias are mirror symmetry.

6. The memory array structure according to claim 2, comprising:
   at least six of the contact areas, wherein each of the word lines electrically connects with the first metal lines through two of the contact points.

7. The memory array structure according to claim 2, comprising:
   a plurality of the ring-shaped electrical patterns.

8. The memory array structure according to claim 7, wherein the ring-shaped electrical patterns electrically connect with one another through the first metal lines.

9. The memory array structure according to claim 7, wherein each of the ring-shaped electrical patterns corresponds to two of the second metal lines.

10. The memory array structure according to claim 1, wherein the memory array structure is applied to a NAND memory device.

11. The memory array structure according to claim 1, further comprising:
    a decoding area disposed on both sides of the ring-shaped electrical pattern.

12. A method for operating a memory array structure, the memory array structure comprising:
    a ring-shaped electrical pattern comprising a plurality of word lines, wherein each of the plurality of word lines is ring-shaped;
    an array area, comprising:
       a first array, comprising a portion of the word lines, a first ground select line and a first string select line, wherein the first ground select line and the first string select line are disposed on both sides of the portion of the word lines;
       a second array, comprising another portion of the word lines, a second ground select line and a second string select line, wherein the second ground select line and the second string select line are disposed on both sides of the another portion of the word lines; and
       a plurality of bit lines disposed on the first array and the second array and cross both of the first array and the second array; and
    a contact area comprising a plurality of contact points, wherein the word lines electrically connect to an external circuit through the contact points;
    the operating method comprising:
    providing a supply voltage to the first string select line and the second string select line;

selecting one of the first array and the second array as a selected array, and another one of the first array and the second array as a non-selected array;

setting a voltage of a string select line in the non-selected array to zero, such that conductive channels of the non-selected array are floating;

setting a voltage of a selected bit line to zero, and other non-selected bit lines to keep floating, wherein the word lines in the selected array have an operating voltage, and the word lines in the non-selected array have a voltage to prevent the operation of the word lines in the non-selected array.

\* \* \* \* \*